United States Patent
Li

(10) Patent No.: US 8,290,109 B2
(45) Date of Patent: *Oct. 16, 2012

(54) CIRCUIT, SYSTEM AND METHOD FOR MULTIPLEXING SIGNALS WITH REDUCED JITTER

(75) Inventor: Gabriel Li, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/038,028

(22) Filed: Mar. 1, 2011

(65) Prior Publication Data

US 2011/0176647 A1 Jul. 21, 2011

Related U.S. Application Data

(63) Continuation of application No. 12/577,477, filed on Oct. 12, 2009, now Pat. No. 7,899,145, which is a continuation of application No. 11/468,195, filed on Aug. 29, 2006, now Pat. No. 7,609,799.

(60) Provisional application No. 60/713,682, filed on Sep. 2, 2005.

(51) Int. Cl.
*H03D 3/24* (2006.01)

(52) U.S. Cl. ........ 375/376; 327/147; 713/400; 713/500; 326/22; 326/29

(58) Field of Classification Search ........... 327/99, 327/147, 407–408; 375/371, 376; 713/400–401, 713/500–503, 600–601; 326/21–22, 29

See application file for complete search history.

(56) References Cited

U.S. PATENT DOCUMENTS

| | | | |
|---|---|---|---|
| 4,572,967 A | 2/1986 | Metz | |
| 4,932,027 A | 6/1990 | Scharrer | |
| 5,045,714 A | 9/1991 | Park et al. | |
| 5,289,048 A | 2/1994 | Ishhara et al. | |
| 5,352,987 A | 10/1994 | Harvey | |
| 5,402,013 A | 3/1995 | Friedrich | |
| 5,574,753 A | 11/1996 | Vartti et al. | |
| 5,621,774 A | 4/1997 | Ishibashi et al. | |
| 5,731,725 A | 3/1998 | Rothenberger et al. | |
| 5,982,220 A | 11/1999 | Kim | |
| 5,991,135 A * | 11/1999 | Saleh | 361/56 |
| 6,105,144 A | 8/2000 | Wu | |
| 6,137,336 A | 10/2000 | Baba et al. | |
| 6,154,509 A * | 11/2000 | Bishop | 375/371 |

(Continued)

FOREIGN PATENT DOCUMENTS

EP 1017193 A 7/2000

(Continued)

OTHER PUBLICATIONS

Written Opinion of the International Searching Authority dated Aug. 29, 2006 for International Application No. PCT/US06/33947; 6 pages.

(Continued)

*Primary Examiner* — Jason M Crawford

(57) ABSTRACT

An apparatus having a plurality of power supply domains and a plurality of logic components. Each of the plurality of logic components resides within a different one of the plurality of power supply domains. Each of the plurality of logic components is configured to operate with a corresponding clock signal within a respective one of the plurality of power supply domains.

19 Claims, 5 Drawing Sheets

U.S. PATENT DOCUMENTS

| | | | |
|---|---|---|---|
| 6,208,193 B1 | 3/2001 | Moyal et al. | |
| 6,239,646 B1 | 5/2001 | Navabi et al. | |
| 6,292,016 B1* | 9/2001 | Jefferson et al. | 326/39 |
| 6,385,214 B1 | 5/2002 | Kikuchi et al. | |
| 6,502,212 B1 | 12/2002 | Coyle et al. | |
| 6,775,339 B1 | 8/2004 | Wildes et al. | |
| 6,927,604 B2* | 8/2005 | Boerstler et al. | 326/93 |
| 7,030,661 B1* | 4/2006 | Doyle | 327/102 |
| 7,042,263 B1* | 5/2006 | Johnson et al. | 327/199 |
| 7,069,458 B1 | 6/2006 | Sardi et al. | |
| 7,079,575 B2* | 7/2006 | Ho et al. | 375/232 |
| 7,231,009 B2* | 6/2007 | Kim et al. | 375/354 |
| 7,305,646 B2* | 12/2007 | McGrath et al. | 326/38 |
| 7,365,580 B2* | 4/2008 | Martin et al. | 327/156 |
| 7,480,849 B2 | 1/2009 | Tomita | |
| 7,609,799 B2* | 10/2009 | Li | 375/376 |
| 7,899,145 B2* | 3/2011 | Li | 375/376 |
| 2002/0089362 A1* | 7/2002 | Lutkemeyer | 327/161 |
| 2004/0120087 A1 | 6/2004 | Ishii | |
| 2004/0268278 A1* | 12/2004 | Hoberman et al. | 716/5 |
| 2006/0156205 A1 | 7/2006 | Tomita | |
| 2006/0165205 A1* | 7/2006 | Dally | 375/371 |

FOREIGN PATENT DOCUMENTS

EP              1187382 A     3/2002

OTHER PUBLICATIONS

International Search Report of the International Searching Authority dated Aug. 29, 2006 for International Application No. PCT/US06/33947; 4 pages.
USPTO Notice of Allowance for U.S. Appl. No. 11/468,195 dated Jun. 15, 2009; 7 pages.
USPTO Notice of Allowance for U.S. Appl. No. 11/468,195 dated Nov. 26, 2008; 7 pages.
USPTO Non-Final Rejection for U.S. Appl. No. 11/468,195 dated Jun. 9, 2008; 6 pages.
USPTO Notice of Allowance for U.S. Appl. No. 12/577,477 dated Oct. 20, 2010; 8 pages.
USPTO Notice of Allowance for U.S. Appl. No. 12/577,477 dated Jul. 22, 2010; 8 pages.
USPTO Non-Final Rejection for U.S. Appl. No. 12/577,477 dated Mar. 10, 2010; 10 pages.
International Search Report for International Application No. PCT/US2006/033947 mailed Jan. 15, 2007.
USPTO Final Rejection for U.S. Appl. No. 09/182,556 dated May 23, 2000; 8 pages.
USPTO Final Rejection for U.S. Appl. No. 09/232,344 dated Sep. 5, 2000; 8 pages.
USPTO Non-Final Rejection for U.S. Appl. No. 09/182,556 dated Jan. 6, 2000; 7 pages.
USPTO Non-Final Rejection for U.S. Appl. No. 09/182,556 dated Sep. 8, 2000; 7 pages.
USPTO Non-Final Rejection for U.S. Appl. No. 09/232,344 dated Mar. 29, 2000; 8 pages.
USPTO Non-Final Rejection for U.S. Appl. No. 10/222,129 dated May 23, 2005; 9 pages.
USPTO Non-Final Rejection for U.S. Appl. No. 10/222,129 dated Nov. 1, 2005; 9 pages.
USPTO Notice of Allowance for U.S. Appl. No. 09/182,556 dated Jan. 26, 2001; 3 pages.
USPTO Notice of Allowance for U.S. Appl. No. 09/232,344 dated Nov. 13, 2000; 2 pages.
USPTO Notice of Allowance for U.S. Appl. No. 10/222,129 dated Feb. 8, 2006; 4 pages.
Written Opinion of the International Searching Authority dated Jan. 15, 2007 for International Application No. PCT/US06/033947; 6 pages.

* cited by examiner

CIRCUIT, SYSTEM AND METHOD FOR MULTIPLEXING SIGNALS WITH REDUCED JITTER

RELATED APPLICATIONS

This application is a continuation of U.S. Non-Provisional application Ser. No. 12/577,477, filed Oct. 12, 2009, now U.S. Pat. No. 7,899,145, issued Mar. 1, 2011, which is a continuation of U.S. Non-Provisional application Ser. No. 11/468,195 filed Aug. 29, 2006, now U.S. Pat. No. 7,609,799 issued Oct. 27, 2009, and U.S. Provisional Application No. 60/713,682 filed on Sep. 2, 2005, each of which are incorporated by reference herein.

BACKGROUND OF THE INVENTION

1. Field of the Invention

This invention relates to electronic circuits and, more particularly, to circuits for multiplexing signals from clock or data sources.

2. Description of the Related Art

The following descriptions and examples are given as background only.

Many electronic systems include one or more synchronous components that rely on receiving related signals at substantially the same time to maintain proper operating characteristics of the electronic system. A computer system is one example of a synchronous system that may include a multitude of interrelated system components, each designed to perform a particular operation in response to a clock signal. In some cases, data transfer between system components may be synchronized by one or more clock signals originating from a common source. The system components may receive the clock signals through a clock network, which may include clock generation and distribution circuits.

In some cases, clock generation may be accomplished by manipulating the output of a source, such as a crystal oscillator, to generate a plurality of clock signals in accordance with the needs of the various components within the computer system. The generated clock signals may then be fanned out to the system components via a clock distribution network. In an ideal situation, the generated clock signals may be received by each of the system components at substantially the same time. In practice, however, timing delays and uncertainties of clock signal generation and distribution may cause one or more system components to receive clock signals at slightly different instances. In some cases, even the smallest variation in the arrival of a clock signal transition relative to a data signal transition may significantly impact system performance and/or reliability. For this reason, good clock distribution is very important to the overall performance and reliability of electronic systems. Unwanted clock skew and jitter are two phenomena that may result from poor clock distribution, thus causing problems in the design and operation of the electronic systems.

As used herein, the term "skew" may be described as a variation in the arrival times of two related signals, which are specified to arrive at the same time. For example, "clock skew" may occur when an active "transition" or "edge" of the clock signal "lags" (i.e., arrives sometime after) or "leads" (i.e., arrives sometime before) the data signal transition(s) received by a system component. Clock skew may be introduced into a clock network through load mismatches, routing parasitics (i.e., interlayer dielectric thickness, interconnect thickness and channel length mismatches), and/or variations in temperature, voltage, and process (i.e., trace conductor length, width, and composition mismatches, capacitive loading, etc.).

Unfortunately, clock skew may adversely affect the timing margins of one or more components within a synchronous system. For example, it is often necessary to properly align the clock signal to the data being sampled at the input latches of a system component to achieve synchronous operation. Such alignment may ensure that the data transition occurs at the proper moment between the edges or active transitions of the clock signal. Synchronous systems, therefore, generally rely on data transitioning and remaining stable from a time, which occurs at least a "setup time" before the clock transition, until at least a "hold time" after the clock transition. Most synchronous system components have stringent setup and hold timing requirements, which are typically specified by a manufacturer of the system component.

As operating speeds increase, the setup and hold timing margins between active transitions of the clock and data signals are reduced, thereby decreasing the window within which a data transition can be successfully latched by a clock transition. For example, edge-sensitive flip-flops may be used for sampling data signals received by a system component. In such an example, a flip-flop may successfully latch a data signal if the data signal is stable during the critical setup and hold periods on either side of the clock transition. However, if clock skew occurs, it may shift the clock transition sufficiently in time to cause a bit error when the data is sampled. As described herein, a "bit error" is a sampling error that occurs when a data signal is incorrectly sampled by a clock transition.

Jitter, on the other hand, generally results from time-varying components of noise sources, and is often defined as the cycle-to-cycle variation in the threshold crossings of a data signal. In other words, jitter may occur in data samples taken near, but not exactly at, the desired sample locations of an individual data signal, such that a sample is temporally displaced by an unknown, though usually small interval (e.g., an interval substantially less than or equal to one clock cycle). Like clock skew, jitter may cause the data signal to be shifted sufficiently in time to produce a bit error when the data signal is incorrectly sampled by the clock signal.

Techniques have been developed to minimize the effects of timing delays, such as clock skew and jitter, which degrade the performance and reliability of synchronous systems. However, most currently used techniques cannot guarantee that a data signal transition will occur at the critical moment between clock signal edges in all conditions. For example, some techniques utilize phase lock loops (PLLs) or delay-locked loops (DLLs) for adding a somewhat variable, though highly consistent amount of delay to a clock path. The added delay may be used to adjust the active edge of a clock signal before it is used for sampling a data signal. As such, a PLL or DLL device could be used to reduce clock skew by adjusting the timing of the clock signal, so that it occurs within the data setup and hold time requirements of a system component. However, the current techniques are not without some disadvantages.

In some cases, more than one PLL or DLL device may be included within a clock network for adjusting the timing of the clock path. Multiple PLL/DLL devices enable the system to multiplex clock signals from different PLL/DLLs. For example, a multiplexer circuit may be included for selectively applying one of the PLL/DLL output signals to the clock path. However, conventional multiplexer designs add crosstalk and power supply noise to the clock path when multiplexing signals (i.e., choosing between more than one signal) from the PLL/DLLs.

The addition of crosstalk and power supply noise increases the amount of jitter on the clock path, and therefore, is very undesirable in clock networks. In some cases, the amount of jitter added to the clock path may cause a bit error when the generated clock signal is used for sampling data. Therefore, a need remains for an improved clock network that does not suffer from crosstalk or supply noise injection. Such a clock network may experience significantly less jitter than conventional networks, thereby improving the overall timing of an electronic device employing the clock network.

SUMMARY OF THE INVENTION

The following description of various embodiments of circuits, systems and methods is not to be construed in any way as limiting the subject matter of the appended claims.

According to one embodiment, an improved multiplexer circuit comprising a plurality of logic gates and a logic block is contemplated herein. For example, the improved multiplexer circuit may include a first logic gate coupled for receiving a first signal, a second logic gate coupled for receiving a second signal, and a third logic gate coupled to outputs of the first and second logic gates for transmitting either the first signal or the second signal. For example, the logic block may be configured for deactivating one of the first and second signals by supplying a static control signal to the first and second logic gates. The logic block ensures that only one active signal (e.g., either the first signal or the second signal) is supplied to the inputs of the first, second and third logic gates. This reduces the amount of jitter within the transmitted signal by eliminating crosstalk and power supply noise injection at the inputs of the logic gates.

In some cases, jitter may be further reduced by arranging the logic gates within separate power domains to further isolate the logic gate inputs. For example, the first, second and third logic gates may be separated from one another by arranging the logic gates within different power supply "islands," each coupled to a different power bus. The common substrate provides an additional amount of isolation. For example, a relatively high substrate resistance also functions to provide isolation between the power supply islands.

In some cases, the first, second and third logic gates may be implemented with NAND gates. However, the first, second and third logic gates are not limited to NAND gates, and may be implemented with a substantially different combination of logic gates (e.g., NOR gates), in other embodiments of the invention. In some cases, the first and second signals may be clock signals. However, the first and second signals are not limited to clock signals, and may comprise data signals, in other embodiments of the invention.

A system comprising the improved multiplexer circuit and at least one system component is also contemplated herein. As noted above, the multiplexer circuit may include at least three logic gates and a logic block, each arranged within a separate power domain. For example, a first logic gate may be coupled for receiving a first signal, and a second logic gate may be coupled for receiving a second signal. However, a third logic gate may be coupled for receiving only one of the first and second signals, depending on a state of a control signal supplied to the first and second logic gates from the logic block. In this manner, the at least one system component may be coupled to an output of the third logic gate for receiving only one of the first and second signals.

In some cases, the multiplexer circuit may be part of a clock network, which is included within the system for adjusting the timing of a clock path. For example, the first and second signals may include clock signals supplied, e.g., from an internal system clock. In some cases, the clock network may include one or more phase shift apparatuses for supplying the first and second signals to the multiplexer circuit. For example, a phase locked loop (PLL) or delay locked loop (DLL) device may be included within the clock network for reducing clock skew by shifting a phase of the system clock signals. However, a phase shift apparatus may not be included within all embodiments of the invention.

A method for multiplexing signals with reduced jitter is also contemplated herein. For example, the method may include supplying a first signal to a first logic gate and a second signal to a second logic gate. Next, one of the first or second signals may be deactivated by supplying a control signal to the first and second logic gates. Finally, the method may include forwarding an active one of the first or second signals to a third logic gate. By supplying only one active signal to each of the logic gates, the steps of deactivating and forwarding enable the first and second signals to be multiplexed with reduced jitter.

BRIEF DESCRIPTION OF THE DRAWINGS

Other objects and advantages of the invention will become apparent upon reading the following detailed description and upon reference to the accompanying drawings in which.

Figure 1:
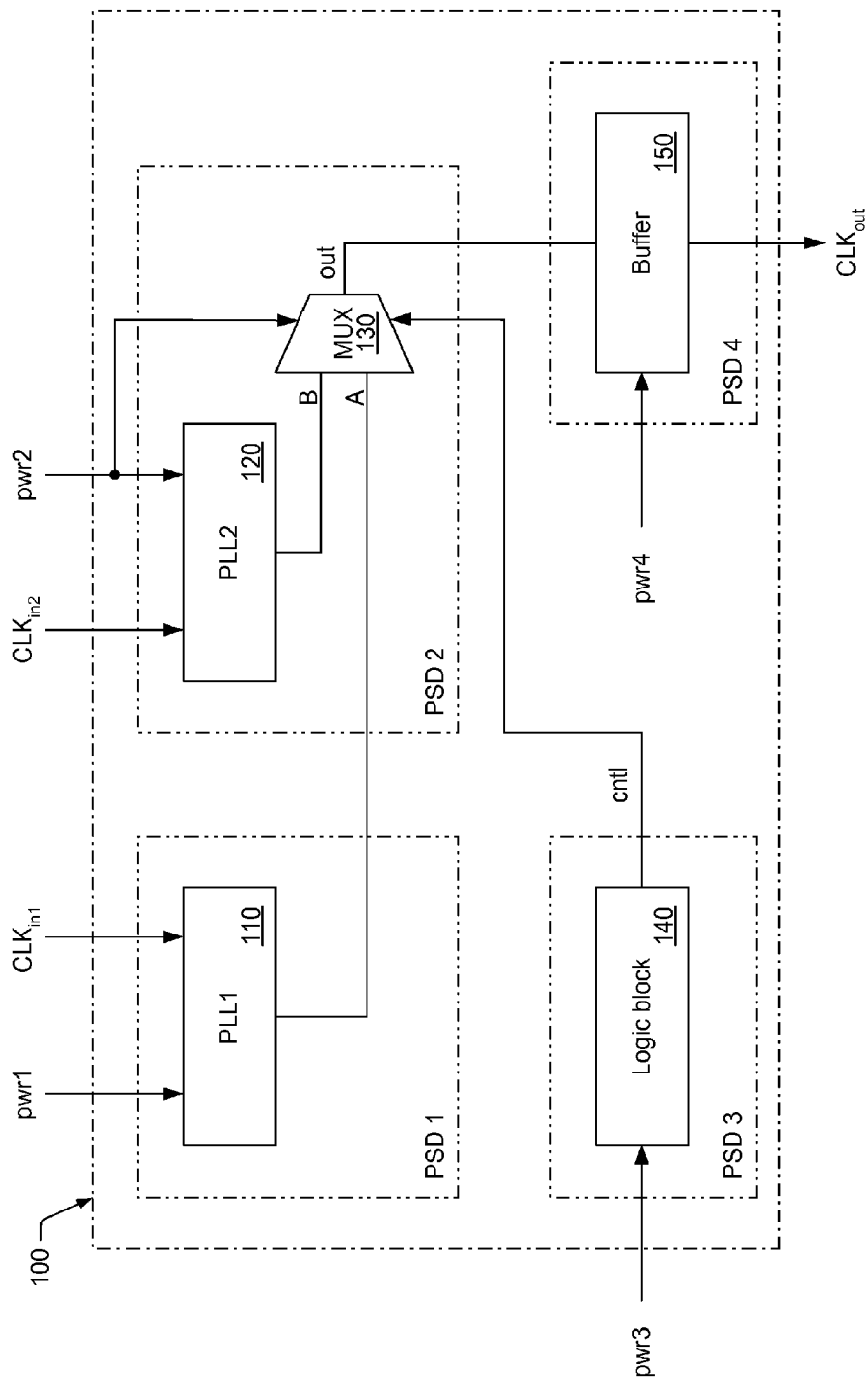
FIG. 1 is block diagram of a circuit comprising an exemplary multiplexer circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

An exemplary clock network 100 is shown in FIG. 1. In the illustrated embodiment, the clock network includes a first PLL 110, a second PLL 120, a multiplexer 130, a logic block 140 and an output buffer 150. In some cases, the first and second PLLs may each be configured for generating one or more clock signals (e.g., signals A and B) for adjusting the timing of a clock path (coupled, e.g., to CLKout). In FIG. 1, the clock signals generated by the PLLs are supplied to the inputs of a multiplexer (130). The logic block supplies a control signal to the multiplexer for selecting one of the clock signals to be output from the multiplexer. In most cases, the chosen clock signal (out) is supplied to the output buffer, before it is applied to the clock path.

The clock network shown in FIG. 1 adds crosstalk and power supply noise to the clock path when multiplexing signals (i.e., choosing between more than one signal) from the PLLs. As described in more detail below, the addition of crosstalk and power supply noise increases the amount of jitter on the clock path, and thus, is very undesirable.

In some cases, crosstalk and power supply noise may be added to the clock path when two or more PLL signals are brought into close proximity at the inputs of the multiplexer. For example, a clock signal (A) from the first PLL may interfere with a clock signal (B) from the second PLL by way of capacitive coupling between the metal wire of the mux inputs and the common silicon substrate. This interference (or "crosstalk") cannot be avoided in current multiplexer designs, due to the close proximity of the mux inputs. As described herein, circuit components arranged in "close proximity" may be located within the same "power domain" and/or coupled to the same power bus.

Figure 2:
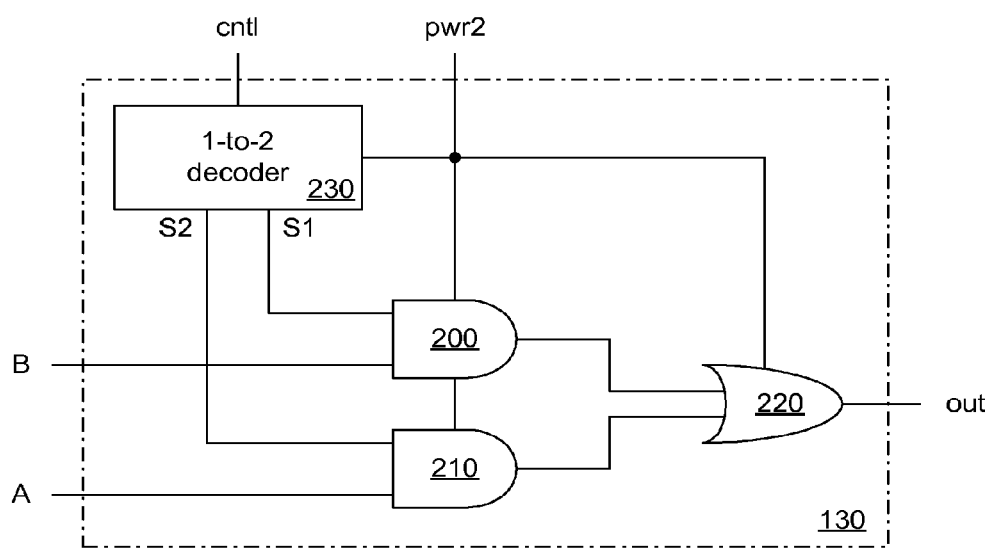
FIG. 2 is a circuit diagram of an exemplary multiplexer circuit.

For example, FIG. 2 illustrates one embodiment of a multiplexer circuit (130) that may be included within the clock network (100) of FIG. 1. In the illustrated embodiment, multiplexer 130 includes a pair of two-input AND gates (200, 210), a two-input NOR gate (220) and a 1-to-2 decoder (230). Each of the AND gates is coupled for receiving a clock signal (e.g., either A or B) from the first and second PLLs (110, 120) and a select signal (e.g., either S1 or S2) from the 1-to-2 decoder (230). The AND gate outputs are coupled to the inputs of the NOR gate for generating the multiplexer output signal (out). Each of the multiplexer components is supplied with the same power bus (e.g., pwr2).

The multiplexer circuit shown in FIG. 2 adds crosstalk to the clock path when multiplexing clock signals A and B, due to the close proximity of the clock signals at the inputs of the multiplexer. In other words, AND gates 200 and 210 are each configured for receiving an active clock signal from the PLLs. Because the AND gates are arranged relatively close to one another, the clock signals may interfere with one another via capacitive coupling between the AND gate inputs and the common substrate.

Power supply noise from the clock network components may also be shared at the inputs of the multiplexer. For example, one or more of the clock network components may be supplied with a separate power bus, as shown in FIG. 1. In the particular embodiment shown, the first PLL is supplied with a first power bus (pwr1), the second PLL and the multiplexer are supplied with a second power bus (pwr2), the logic block is supplied with a third power bus (pwr3) and the output buffer is supplied with a fourth power bus (pwr4). In this manner, the first PLL, the second PLL, the logic block and the output buffer may each be implemented within a separate "power domain," "power supply island," or "power supply block." It is noted that, although multiplexer 130 is located with the second power supply block, it can be located within any supply block and still exhibit the following problem.

All power supplies generate some amount of noise, which propagates along the power bus as "power supply noise." Power supply noise affects circuit components by contributing to the overall noise level of the output signals generated by the components. In some cases, the noise contributions from each power domain may be combined when the output signals from multiple circuit components come in close proximity to one another (e.g., when multiplexing signals). In the embodiment of FIG. 1, the clock signals from the first and second PLLs and the control signal from the logic block contain power supply noise from power buses 1, 2 and 3. As described in more detail below, the supply noises from power buses 1, 2 and 3 are combined within the multiplexer, and pass directly to the output buffer in the fourth power domain. The fourth power domain contributes its own amount of noise, so that the final signal (CLKout) from the output buffer contains noise components from all four power domains.

The multiplexer circuit shown in FIG. 2 adds power supply noise to the clock path by arranging the multiplexer components within close proximity to one another and supplying active clock and control signals to the closely spaced components. This enables the noise components of one signal to interfere (or combine) with those of another signal. Since the active clock and control signals contain supply noises from power domains 1, 2 and 3, the supply noises from each of these domains are combined within the multiplexer output signal (out). If the output signal is forwarded to a buffer located within another power domain (as shown in FIG. 1), the final signal (CLKout) will contain noise components from four distinct power domains.

In some cases, the amount of crosstalk and power supply noise added to the clock path may cause a bit error when the final signal (CLKout) is used for sampling data. Therefore, a need remains for an improved clock network that does not suffer from crosstalk or supply noise injection. Such a clock network would experience significantly less jitter than currently available clock networks, thereby improving the overall timing of an electronic device employing the clock network.

Figure 3:
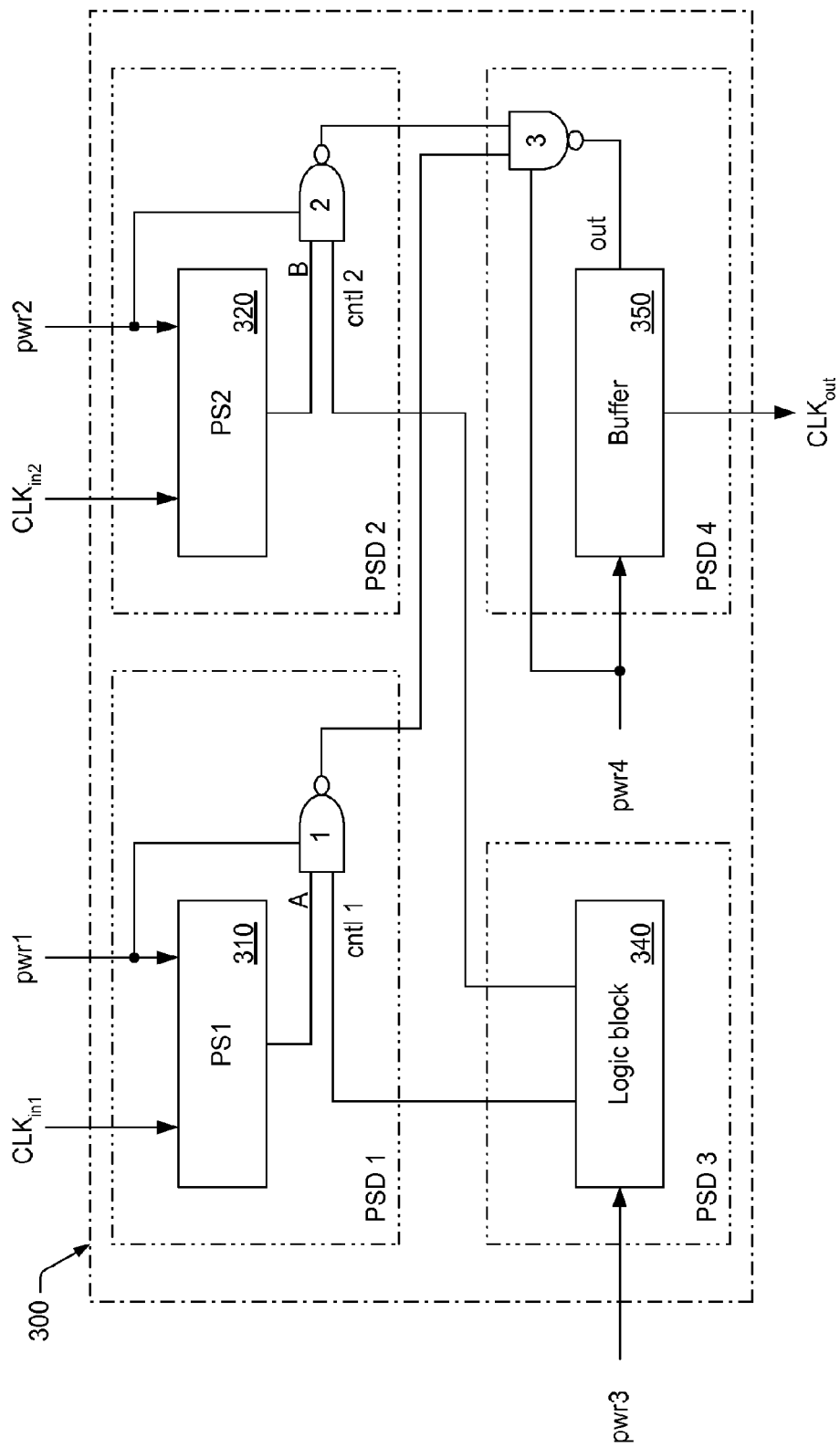
FIG. 3 is a block diagram of a circuit comprising an improved multiplexer circuit having reduced crosstalk and power supply noise, according to one embodiment of the invention.

One embodiment of an improved clock network 300 is shown in FIG. 3. As described in more detail below, the illustrated embodiment provides a solution for reducing the cycle-to-cycle jitter of a multiplexed ("muxed") clock output by eliminating crosstalk and power supply noise injection between the muxed signals.

As shown in FIG. 3, the improved clock network (300) may include a first phase shift apparatus (PS1) 310 and a first NAND gate in a first power supply domain (PSD 1), a second phase shift apparatus (PS2) 320 and a second NAND gate in a second power supply domain (PSD 2), a logic block 340 in a third power supply domain (PSD 3), and a third NAND gate and output buffer 350 in a fourth power supply domain (PSD 4). In some cases, the phase shift apparatuses may be implemented with a phase locked loop (PLL) or delay locked loop (DLL) device. As such, the phase shift apparatuses may be included for adding a variable, though highly consistent amount of delay (i.e., phase shift) to the clock signals ($CLK_{in1}$, $CLK_{in2}$) supplied thereto. It is noted, however, that PS1 and PS2 may not be included in all embodiments of the invention. In some cases, the clock signals ($CLK_{in1}$, $CLK_{in2}$) from a clock source (such as, e.g., a crystal oscillator or external clock source) may be supplied directly to the inputs of the first and second NAND gates.

As used herein, a component may be arranged within a separate "power domain," if that component is supplied with its own power bus and physically separated from components arranged in other power domains. For example, NAND gates 1, 2 and 3 are each arranged within a different power domain. As shown in FIG. 3, NAND gates 1, 2 and 3 are spaced apart from one another and supplied with a different power bus (e.g., pwr1, pwr2, or pwr3). In some cases, the NAND gates may be located in different supply islands, which are separated from each other by a physical distance. In some cases, the supply islands may include supply guard rings for further isolation.

In some cases, the logic gates may be implemented with two-input NAND gates, as shown in FIG. 3. In the illustrated embodiment, the output of the first phase shift apparatus is coupled to a first input of NAND gate 1 for supplying a phase-shifted clock signal (A) thereto. The second phase shift apparatus is similarly coupled for supplying another phase-shifted clock signal (B) to a first input of NAND gate 2. The first and second NAND gates are controlled by the logic block (340) in the third power supply domain. For example, the logic block is coupled for supplying a pair of control signals (cntl 1, cntl 2) to the second inputs of NAND gates 1 and 2. As described in more detail below, the control signals may eliminate crosstalk and power supply noise injection by deactivating one of the clock signals supplied to NAND gates 1 and 2. The outputs of NAND gates 1 and 2 are coupled to the inputs of NAND gate 3 in the fourth power supply domain. In some cases, the output (out) of the third NAND gate may be coupled to a buffer circuit (350), which may also be arranged in the fourth power supply domain. However, the buffer circuit may not be included in all embodiments of the invention. In some cases, the output of the third NAND gate may be directly coupled to an internal system clock path (see, FIG. 5).

As shown in FIG. 3, the functionally of the multiplexer is broken up into three NAND gates, each spaced apart from one another and arranged within a separate power domain. A logic block (340), arranged within another power domain, is coupled to the first and second NAND gates for eliminating the crosstalk and supply noise created within typical multiplexer circuits. For example, the logic block is configured for supplying static control signals (either a logic 1 or logic 0) to the first and second NAND gates. Although actively switching clock signals (A and B) are supplied to the first inputs of NAND gates 1 and 2, the outputs of the NAND gates are only allowed to switch when a logic 1 control signal is supplied to the second input of the logic gate. In order to eliminate crosstalk and supply noise, only one of the first and second NAND gates is allowed to pass the actively switching clock signal. The output of the other NAND gate is rendered static by supplying a logic 0 control signal to the second input of that logic gate. Since the static signal injects no switching noise, the inputs of the NAND gates are isolated from one another.

Therefore, the improved solution shown in FIG. 3 operates by separating the multiplexing (MUX) function into three separate logic gates and distributing them across three distinct power domains. The theory of the operation is to allow only one switching input per logic gate. The control signals supplied to the first and second logic gates are static signals with one high and the other low. Instead of supplying two actively switching clock signals to the third logic gate, the control signals are used for deactivating one of the clock signals in its own power domain. This enables the invention to eliminate all crosstalk and supply noise injection at the inputs of the logic gates.

Various advantages are provided by the improved solution shown in FIG. 3. For example, crosstalk and supply noise injection are eliminated by: (i) separating the multiplexing (MUX) function into three separate logic gates distributed across three distinct power domains, and (ii) allowing only one switching input per logic gate. In other words, cross talk and supply noise injection are eliminated since each clock signal is gated in its own power domain. The improved solution improves the cycle-to-cycle jitter of the multiplexed clock output by reducing crosstalk and supply noise injection. In addition, the improved solution provides built in delay matching by utilizing three substantially identical logic gates (e.g., NAND gates 1, 2, and 3). These features are generally desirable for customers/users.

In some cases, the improved solution shown in FIG. 3 may be used in clock or other timing generation devices. Such devices are widely used in many types of electronic devices, including motherboards in personal computers and communications equipment, and in consumer devices such as cell phones, digital cameras, MP3 players, and many other home and entertainment products.

In some cases, the improved solution may include a phase shift apparatus (such as a PLL or DLL) for eliminating clock skew before the clock signals are supplied to the first and second logic gates. For example, phase lock loops may be used in certain applications, such as frequency synthesizers, to reduce the lock time. For example, when frequency hopping is used in modern wireless networks (e.g., 3G cellular, WCDMA, WLAN, and Bluetooth), the time to settle is considered "dead time" where no information is transmitted, and thus time is wasted. Speeding up the lock time increases the effective data rate, and thus, the value of such networks. Another example would be in wireline networks, where a reduced lock time helps to minimize the amount of data lost. That is, if a long string of zeros or ones is in the data path and the PLL loses lock, reacquiring lock sooner results in more data recovered by the CDR circuitry. Overall, phase lock loops are very important building blocks of modern electronic systems. It should be noted, however, that the improved multiplexer circuit described herein does not require the use of a PLL to reap the advantages mentioned above. Although the phase shift apparatuses shown in FIG. 3 may further improve the timing of the clock path by reducing clock skew, they should be considered optional features of the invention.

Figure 4:
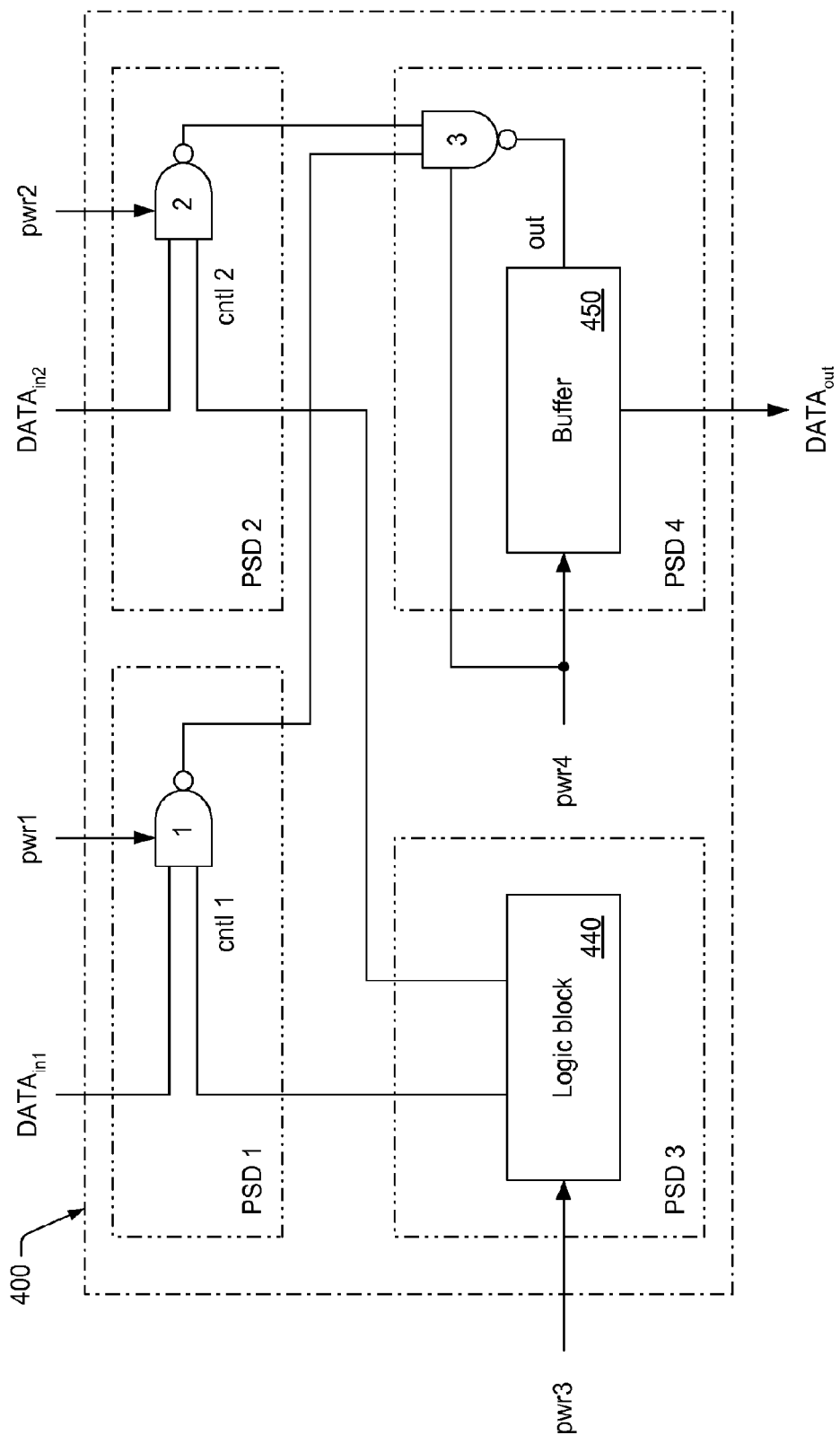
FIG. 4 is a block diagram of a circuit comprising an improved multiplexer circuit having reduced crosstalk and power supply noise, according to another embodiment of the invention.

In addition, the multiplexer circuit shown in FIG. 3 represents only one manner in which signals may be multiplexed with reduced jitter. One skilled in the art would recognize that other embodiments exist. For example, the clocking signals shown in FIG. 3 may be multiplexed with a substantially different combination of logic gates. In one embodiment, the NAND gates shown in FIG. 3 may be replaced with NOR gates. Other combinations of logic gates not specifically mentioned herein may also be possible. In addition to clocking signals, another multiplexer circuit is provided herein for multiplexing other system critical signals (such as data signals) with reduced cycle-to-cycle jitter. One embodiment of such a circuit is shown in FIG. 4 and described in more detail below.

According to one embodiment, multiplexer circuit 400 may include a first NAND gate in a first power supply domain (PSD 1), a second NAND gate in a second power supply domain (PSD 2), a logic block 440 in a third power supply domain (PSD 3), and a third NAND gate and (optional) output buffer 450 in a fourth power supply domain (PSD 4). As such, the multiplexer circuit (400) shown in FIG. 4 differs from the circuit (300) shown in FIG. 3 by eliminating the phase shift apparatuses and supplying a pair of data signals ($DATA_{in1}$, $DATA_{in2}$) to the first and second NAND gates. The multiplexer circuit (400) shown in FIG. 4 reduces cycle-to-cycle jitter of the multiplexed data signals by eliminating crosstalk and power supply noise injection, as described above. As noted above, the multiplexing function may be alternatively provided by NOR gates, or any other combination of logic gates arranged in separate power domains and supplied with only one actively switching input.

Figure 5:
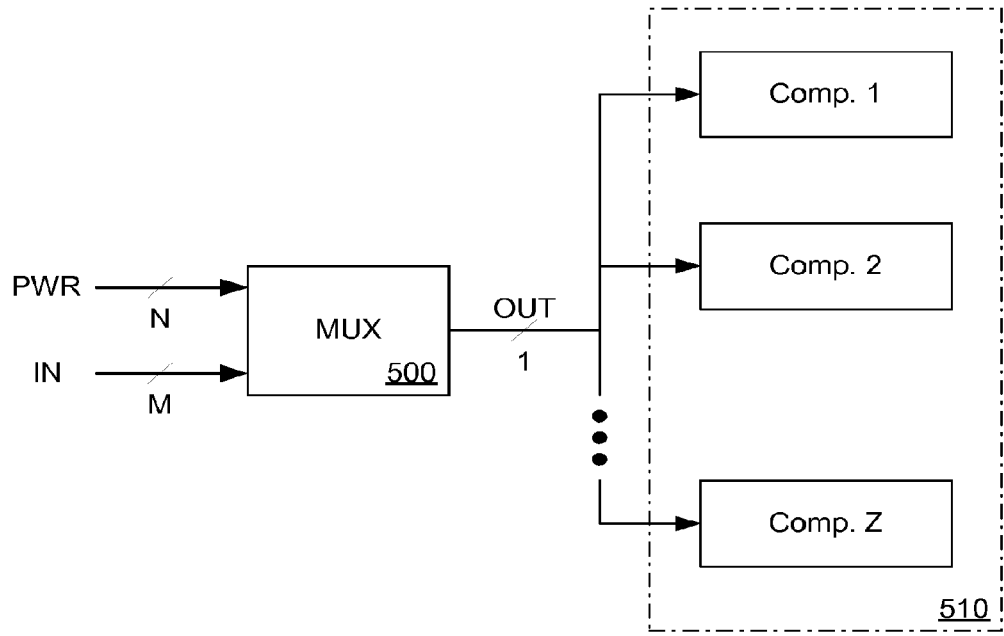
FIG. 5 is a block diagram of a system comprising the improved multiplexer of FIG. 3 or 4 and a plurality of system components.

A system comprising the improved multiplexer circuit is also contemplated herein. In addition to other circuitry, the system may include a multiplexer circuit 500 and one or more system components 510, as shown in FIG. 5. In general, the multiplexer circuit 500 may be coupled for generating an output signal (OUT) by multiplexing one or more input signals (IN) supplied thereto. In most cases, the input signals may be clock or data signals. As such, multiplexer circuit 500 may be implemented with one of the circuits shown in FIGS. 3 and 4. As noted above, the multiplexer circuit may reduce the amount of jitter within the output signal by separating the multiplexing function into three logic gates, which are distributed across three distinct power domains. As such, multiplexer circuit 500 may be coupled to at least three different power buses (PWR). In some cases, the multiplexed output signal (OUT) may be distributed to one or more system components 510, as shown in FIG. 5. If distributed along a clock path, the multiplexer circuit may be included within an improved clock network.

Figure 6:
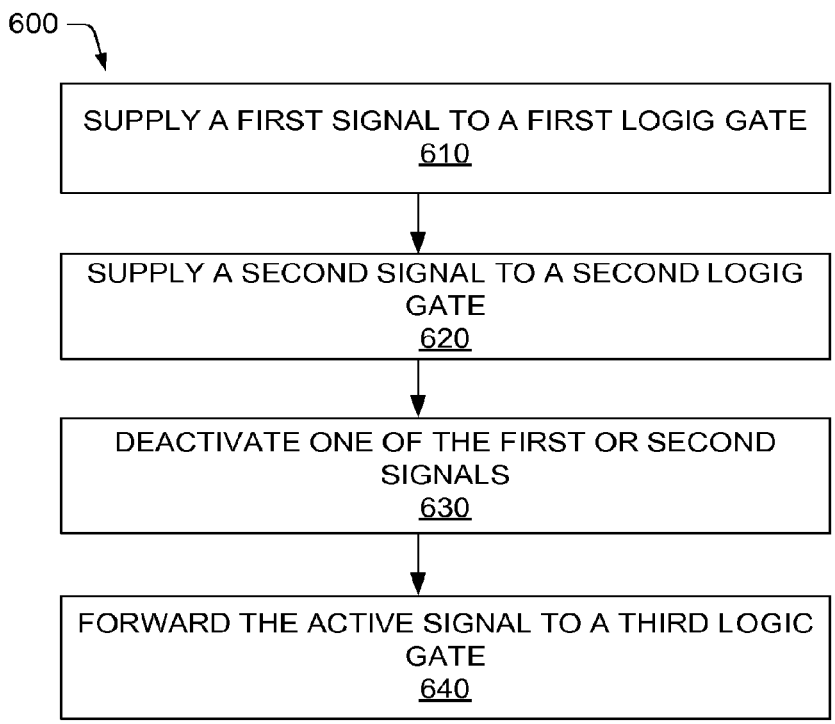
FIG. 6 is a flowchart diagram of a method for multiplexing signals with reduced crosstalk and power supply noise.

A method for multiplexing signals with reduced jitter is also contemplated herein. As shown in FIG. 6, for example, the method (600) may include supplying a first signal to a first logic gate (in step 610) and a second signal to a second logic gate (in step 620). As noted above, the first and second signals may be clock or data signals. In addition, the method may include deactivating one of the first or second signals (in step 630). For example, one of the signals may be deactivated by supplying a logic low control signal (NAND implementation) or a logic high control signal (NOR implementation) to the first and second logic gates. Next, the method may include forwarding an active one of the first or second signals to a third logic gate configured for outputting an active one of the first and second signals (in step 640).

The steps of deactivating and forwarding enable the first and second signals to be multiplexed with reduced jitter. For example, the method allows only one active signal to be supplied to each of the first, second and third logic gates. As noted above, the first and second logic gates are each configured for receiving an active clock (or data) signal and a static control signal. The third logic gate is configured for receiving only one input signal, the other input is disabled in the deactivation step. In this manner, the method described herein reduces jitter by eliminating crosstalk and power supply noise injection at the inputs of the logic gates. The logic gate inputs may be further isolated, in some embodiments, by separating the logic gates within distinct power domains. In other words, the logic gates may be physically separated and supplied with different power buses to further improve the isolation there between.

Embodiments of the present invention are well suited to performing various other steps or variations of the steps recited herein, and in a sequence other than that depicted and/or described herein. In one embodiment, the process of selecting one clock source from multiple clock sources may be carried out by processors and other electrical and electronic components. For example, a processor can select one pin to be the CPU clock or PCI Express clock.

For purposes of clarity, many of the details of the improved multiplexer circuit and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this invention.

What is claimed is:

1. An apparatus, comprising:
   a plurality of power supply domains; and
   a plurality of logic components, each of the plurality of logic components within a different one of the plurality of power supply domains, wherein each of the plurality of logic components is configured to operate with a corresponding clock signal within a respective one of the plurality of power supply domains, wherein at least two of the plurality of logic components comprises substantially identical logic gates, and wherein each of the substantially identical logic gates comprises only one switching input to receive the corresponding clock signal within the respective one of the plurality of power supply domains.

2. The apparatus of claim 1, wherein the plurality of power supply domains comprises at least three power supply domains and wherein the plurality of logic components comprise at least three logic components.

3. The apparatus of claim 1, wherein the plurality of power supply domains comprises first, second, third and fourth power supply domains, wherein a plurality of logic components comprises:
   a first logic gate arranged within the first power supply domain and configured to operate with a first clock signal;
   a second logic gate arranged within the second power supply domain and configured to operate with a second clock signal;
   a logic block arranged within the third power supply domain and coupled to the first and second logic gates; and
   a third logic gate arranged within the fourth power supply domain and coupled to the first and second logic gates.

4. The apparatus of claim 3, wherein the first, second and third logic gates each comprise either a two-input NAND gate or a two-input NOR gate.

5. The apparatus of claim 3, wherein the first logic gate has a first input coupled to receive the first signal and second input coupled to receive a control signal from the logic block,
   wherein the second logic gate has a first input coupled to receive the second signal and a second input coupled to receive the control signal from the logic block,
   wherein the logic block is configured to supply the control signal to the first and second logic gates to deactivate one of the first and second signal, and
   wherein the third logic gate has inputs coupled to receive outputs of the first and second logic gates and transmit either the first signal or the second signal, which has not been deactivated by the logic block.

6. The apparatus of claim 1, wherein each of the plurality of power supply domains is supplied with its own power bus and physically separated from logic components arranged in other power supply domains.

7. A motherboard comprising the clock generation device of claim 6.

8. A multiplexer comprising the apparatus of claim 1.

9. A clock generation device comprising the apparatus of claim 1.

10. A phone comprising the apparatus of claim 1.

11. A system, comprising:
a circuit comprising three logic gates and a logic block, each arranged within a separate power supply domain, wherein:
a first of the three logic gates is operatively coupled with a first signal;
a second of the three logic gates is operatively coupled with a second signal; and
a third of the three logic gates operatively coupled with one of the first and second signals, depending on a state of a control signal; and
a system component coupled to the third logic gate.

12. The system of claim 11, wherein the first, second and third logic gates each comprise either a NAND gate or a NOR gate.

13. The system of claim 11, wherein the first and second signals comprise clock signals.

14. The system of claim 11, further comprising one or more phase shift apparatuses coupled to the circuit.

15. The system of claim 14, wherein the one or more phase shift apparatuses each comprise either a phase locked loop (PLL) device or a delay locked loop (DLL) device.

16. The clock network comprising the system of claim 14.

17. A method, comprising:
deactivating one of a first signal or a second signal by supplying a control signal to first and second logic gates; and
forwarding an active one of the first or second signals to a third logic gate, wherein the first, second and third logic gates are spaced apart from one another and respectively arranged within a first, second and third power supply domain.

18. The method of claim 17, wherein the first and second signals comprise clock signals.

19. The method of claim 18, wherein the first and second signals comprise data signals.

* * * * *